(12) United States Patent
Ohmori et al.

(10) Patent No.: US 10,653,001 B2
(45) Date of Patent: May 12, 2020

(54) RELEASE MATERIAL

(71) Applicant: KURARAY CO., LTD., Kurashiki-shi (JP)

(72) Inventors: Kazuyuki Ohmori, Saijo (JP); Tatsuya Sunamoto, Chiyoda-ku (JP)

(73) Assignee: KURARAY CO., LTD., Kurashiki-shi (JP)

( * ) Notice: Subject to any disclaimer, the term of this patent is extended or adjusted under 35 U.S.C. 154(b) by 0 days.

(21) Appl. No.: 16/270,081

(22) Filed: Feb. 7, 2019

(65) Prior Publication Data

US 2019/0174622 A1 Jun. 6, 2019

Related U.S. Application Data

(60) Continuation of application No. 15/140,097, filed on Apr. 27, 2016, now Pat. No. 10,244,619, which is a
(Continued)

(30) Foreign Application Priority Data

Dec. 27, 2010 (JP) ................................ 2010-289854

(51) Int. Cl.
*B32B 3/00* (2006.01)
*H05K 1/02* (2006.01)
(Continued)

(52) U.S. Cl.
CPC ....... *H05K 1/0245* (2013.01); *B29C 37/0075* (2013.01); *B29C 43/18* (2013.01);
(Continued)

(58) Field of Classification Search
CPC .. H05K 1/0245; H05K 1/0242; H05K 1/0296; H05K 1/0306; H05K 1/09; H05K 3/281; B29C 37/0075; B29C 43/18
See application file for complete search history.

(56) References Cited

U.S. PATENT DOCUMENTS

| | | |
|---|---|---|
| 4,861,648 A | 8/1989 | Kleinschmidt et al. |
| 5,080,979 A | 1/1992 | Shigemoto et al. |
| (Continued) | | |

FOREIGN PATENT DOCUMENTS

| | | |
|---|---|---|
| JP | 60-106719 U | 7/1985 |
| JP | 64-53322 A | 3/1989 |
| (Continued) | | |

OTHER PUBLICATIONS

Office Action dated May 17, 2016 in Japanese Patent Application No. 2012-550833.
(Continued)

*Primary Examiner* — Elizabeth E Mulvaney
(74) *Attorney, Agent, or Firm* — Oblon, McClelland, Maier & Neustadt, L.L.P.

(57) ABSTRACT

Provided is a method of manufacturing a circuit board including preparing a board structural body (11) and covering a conductor circuit element (13) on an outermost layer of the board structural body (11) with a cover film (14), wherein a heat treatment is performed while having a release material (15) interposed between the cover film (14) and a heat-processing device. The release material (15) is a laminate at least including, sequentially from the cover film toward the heat-processing device, a low friction film (16) selected from an ultrahigh-molecular-weight polyethylene film and a polytetrafluoroethylene film, a first aluminum foil (17), a first high-density polyethylene film (18a), a second high-density polyethylene film (18b), and a second aluminum foil (19). The first high-density polyethylene film (18a) and the second high-density polyethylene film (18b) are positioned such that respective MD directions are perpendicular to each other.

8 Claims, 5 Drawing Sheets

Related U.S. Application Data division of application No. 13/997,883, filed as application No. PCT/JP2011/079191 on Dec. 16, 2011, now Pat. No. 9,363,890.

(51) Int. Cl.

| | | |
|---|---|---|
| *B29C 37/00* | (2006.01) | |
| *B29C 43/18* | (2006.01) | |
| *H05K 3/28* | (2006.01) | |
| *H05K 1/03* | (2006.01) | |
| *H05K 1/09* | (2006.01) | |
| *B29C 43/20* | (2006.01) | |

(52) U.S. Cl.
CPC ......... *H05K 1/0242* (2013.01); *H05K 1/0296* (2013.01); *H05K 1/0306* (2013.01); *H05K 1/09* (2013.01); *H05K 3/281* (2013.01); *B29C 43/203* (2013.01); *H05K 1/0237* (2013.01); *H05K 2201/0129* (2013.01); *H05K 2201/0141* (2013.01); *H05K 2203/068* (2013.01); *Y10T 156/10* (2015.01)

(56) References Cited

U.S. PATENT DOCUMENTS

| | | | |
|---|---|---|---|
| 5,234,522 | A | 8/1993 | Suzuki et al. |
| 5,445,883 | A | 8/1995 | Kobayashi et al. |
| 6,027,771 | A | 2/2000 | Moriya |
| 8,771,458 | B2 | 7/2014 | Onodera et al. |
| 2006/0028612 | A1 | 2/2006 | Smith et al. |
| 2009/0065240 | A1 | 3/2009 | Onodera et al. |
| 2009/0133911 | A1 | 5/2009 | Kuki et al. |
| 2013/0176691 | A1 | 7/2013 | Stevens et al. |

FOREIGN PATENT DOCUMENTS

| | | |
|---|---|---|
| JP | 1 127715 | 8/1989 |
| JP | 2-23401 Y2 | 6/1990 |
| JP | 2-175247 A | 7/1990 |
| JP | 2 177497 | 7/1990 |
| JP | 3-205151 A | 9/1991 |
| JP | 3-77978 B2 | 12/1991 |
| JP | 5 7067 | 1/1993 |
| JP | 2001 127117 | 5/2001 |
| JP | 2002-59515 A | 2/2002 |
| JP | 2003 124580 | 4/2003 |
| JP | 2005-19657 A | 1/2005 |
| JP | 2007 019338 | 1/2007 |
| JP | 2011-175988 A | 9/2011 |
| TW | 201008770 A1 | 3/2010 |
| WO | 2007/013330 A1 | 2/2007 |
| WO | 2008/012940 A1 | 1/2008 |
| WO | 2009 157143 | 12/2009 |

OTHER PUBLICATIONS

Office Action dated Jun. 21, 2016 in Japanese Patent Application No. 2012-550833.
Extended European Search Report dated Jul. 7, 2017 in European Patent Application No. 11853488.2.
Chinese Office Action dated Sep. 21. 2018 in Patent Application No. 201610257650.3 (with English summary).
Korean Office Action dated Jun. 25, 2018 in Patent Application No. 10-2013-7016845 (with Machine English language translation).
Office Action dated Dec. 12, 2017 in Korean Patent Application No. 10-2013-7016845 (with English language translation).
Combined Chinese Office Action and Search Report dated Feb. 5, 2018 in Patent Application No. 201610257650.3 (with English language translation and English translation of categories of cited documents).
English translation of JP01-127715, Sunami et al., originally published Aug. 31, 1989.
International Search Report dated Mar. 19, 2012 in PCT/JP11/079191 filed Dec. 16, 2011.
Notification of Reason(s) for Rejection dated Apr. 14, 2015 in Japanese Patent Application No. 2012-550833 (with English language summary).
Combined Office Action and Search Report dated Jul. 17, 2015 in Chinese Patent Application No. 201180062324.2 (with English language translation).
Office Action dated Dec. 22, 2015 in Japanese Patent Application No. 2012-550833.
Notification of Reason dated Feb. 11, 2019 issued in corresponding Korean patent application No. 10-2018-7037752 (with machine translation).

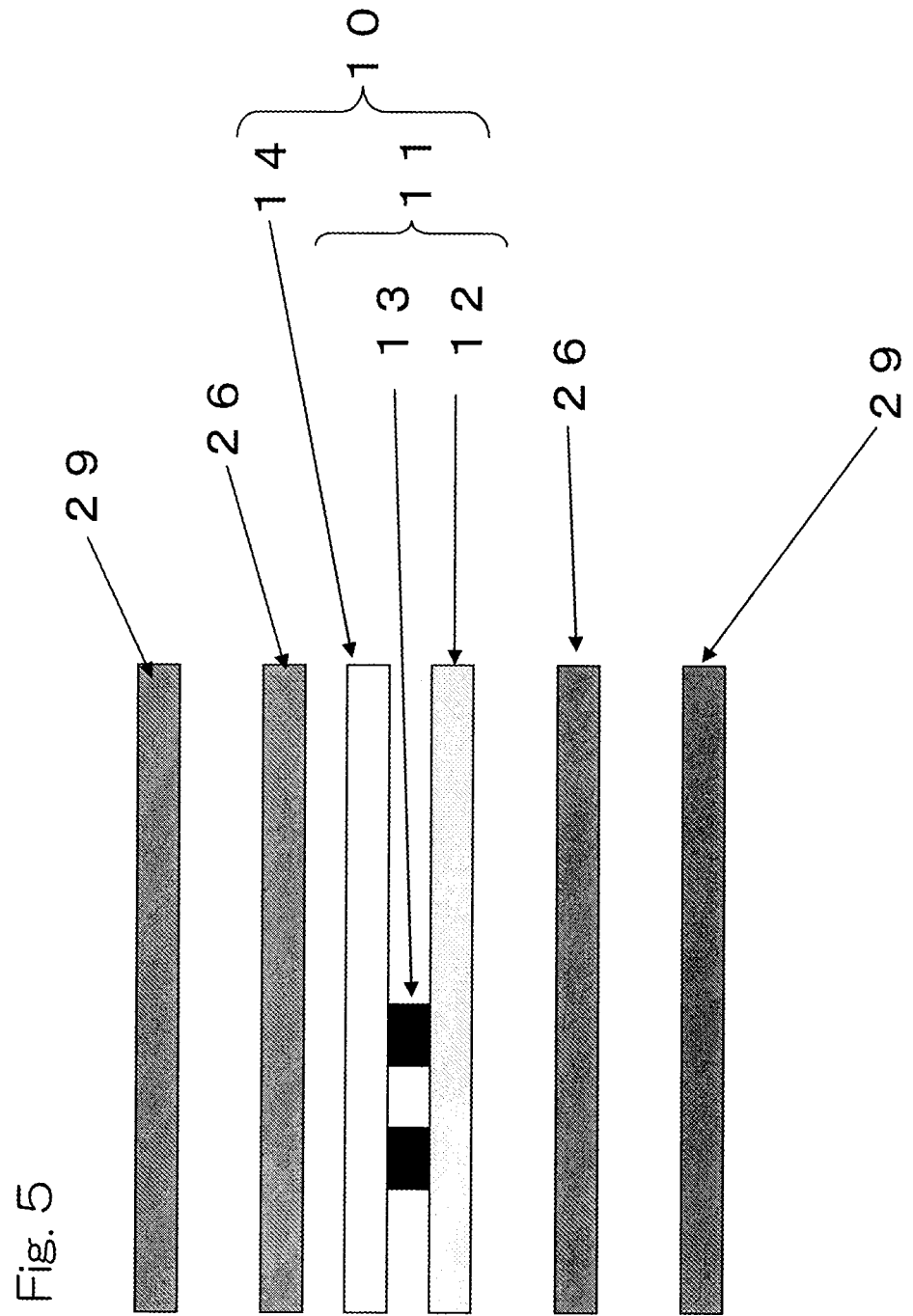

RELEASE MATERIAL

CROSS REFERENCE TO RELATED APPLICATIONS

This application is a continuation of U.S. patent application Ser. No. 15/140,097, filed on Apr. 27, 2016, which was a divisional of U.S. patent application Ser. No. 13/997,883, filed on Jun. 25, 2013, which was a 35 U.S.C. § 371 national stage patent application of International patent application PCT/JP2011/079191, filed on Dec. 16, 2011, published as WO/2012/090733 on Jul. 5, 2012, the text of which is incorporated by reference, and claims the benefit of the filing date of Japanese patent application No. 2010-289854, filed Dec. 27, 2010, the entire disclosure of which is herein incorporated by reference as a part of this application.

FIELD OF THE INVENTION

The present invention relates to a circuit board comprising a cover film of a thermoplastic polymer (hereinafter, may be referred to as a thermoplastic liquid crystal polymer or simply abbreviated as a liquid crystal polymer) capable of forming an optically anisotropic melt phase, and a method of manufacturing the same.

BACKGROUND ART

Circuit boards, which are used as memories, processors, etc. included in information processing equipment such as personal computers, servers, routers, and storages, informational on-board terminals, and information home appliances such as televisions and cameras, play an extremely important role as functional circuits or boards connecting functional modules.

However, in such circuit boards, ion migration that occurs due to moisture from water vapor and the like has become a problem in recent years. When ion migration occurs, a metal used as wiring moves on a board, and may ultimately destroy the circuit board.

Therefore, for example, Patent Document 1 (JP Laid-open Patent Publication No. 2003-124580) discloses, in order to provide water-vapor barrier property, a laminated body obtained by laminating a film formed from a thermoplastic resin that shows optical anisotropy when being melted on a circuit surface of a flexible printed wiring board through a pressure-sensitive adhesive layer and/or an adhesive layer.

In addition, Patent Document 2 (JP Laid-open Patent Publication No. 2007-19338) discloses an electronic circuit board comprising a liquid crystal polymer sheet, the liquid crystal polymer sheet having a surface on which a short-wavelength ultraviolet ray is irradiated, and being thermocompressively bonded on circuit surface(s) formed on one surface or both surfaces of a liquid crystal polymer sheet in a state that the circuit surface(s) and the irradiation surface are in contact with each other.

In such laminated body as well as electronic circuit board, it is possible to provide water resistance to a circuit board by covering circuit surface(s) with a liquid crystal polymer sheet.

PATENT DOCUMENT

[Patent Document 1] JP Laid-open Patent Publication No. 2003-124580

[Patent Document 2] JP Laid-open Patent Publication No. 2007-19338

SUMMARY OF THE INVENTION

However, since an adhesive layer is essential in the circuit board of Patent Document 1, the adhesive layer fails to make it possible to improve dielectric property and dimensional stability of a circuit board, and manufacturing steps of the circuit board also become complicated.

Furthermore, in the circuit board of Patent Document 2, since ultraviolet ray is irradiated on an adhesive surface of a cover film of a liquid crystal polymer in order to soften the film, the cover film easily deforms in thermocompression bonding, and it is difficult to cover conductor circuit on the board with a cover film at a uniform thickness.

Therefore, an objective of the present invention is to provide a circuit board comprising a cover film of a thermoplastic liquid crystal polymer, in which a conductor circuit element can be covered with the cover film at an approximately uniform thickness without gaps, and a method of manufacturing the circuit board.

Another objective of the present invention is to provide a circuit board not only having excellent water barrier property but also being capable of effectively suppressing generation of noise, and a method of manufacturing the circuit board.

Furthermore, another objective of the present invention is to provide a method that enables to manufacture a circuit board having low loss and small signal distortion at a low cost.

Means for Solving the Problems

The present inventors have conducted intensive research to achieve the above described objectives, and, as a result, found that (1) when a liquid crystal polymer film is used as a cover film to be thermally bonded (fused), such cover film needs not only to provide a coating for a conductor circuit element and a board disposed as an outermost layer in the circuit board without gaps, but also to cover the board along concavities and/or convexities thereon at an approximately uniform thickness in order to prevent deterioration of electrical properties (e.g., dielectric constant, dielectric loss tangent) of the circuit board.

Furthermore, the present inventors have also found that: (2) such liquid crystal polymer film having a high melt fluidity cannot provide a uniform thickness coating when an ultrahigh-molecular-weight polyethylene film conventionally used as a release film is employed, because although the ultrahigh-molecular-weight polyethylene film is superior in releasability and heat resistance, the ultrahigh-molecular-weight polyethylene film having a large molecular weight cannot follow concavities and/or convexities on the board due to limitation in the motion of its molecule chains even when being melted; whereas, (3) when a high-density polyethylene film is used in a state sandwiched between aluminum foils, although the film has followability because its molecule chains can move easily, the film has high anisotropy so as to result in deformation of a conductor circuit element that has been disposed.

As a result of further conducting research based on these findings, the present inventors have finally found that (4) when a release film obtained by combining an ultrahigh-molecular-weight polyethylene film with a pair of high-density polyethylene films sandwiched by aluminum foils, and by positioning machine directions (hereinafter, abbreviated as MD direction) of the high-density polyethylene films to be perpendicular to each other is used for heat treatment so as to provide a coating of a liquid crystal polymer film as a cover film, the cover film can cover a conductor circuit element on a board at an approximately uniform thickness; and further have found that (5) a polytetrafluoroethylene film (hereinafter, also abbreviated as a PTFE film) having a low friction property can be employed instead of the ultrahigh-molecular-weight polyethylene film having a low friction property for achieving an effect which is similar to the effect obtained in the releasing material including the ultrahigh-molecular-weight polyethylene film. With these findings, the present inventors have accomplished the present invention.

Thus, the present invention includes a circuit board at least comprising: a board structural body including a board and a conductor circuit element disposed on at least one surface of the board; and a cover film on at least a conductor circuit side of outermost layers of the board structural body, wherein the cover film comprises a film of a thermoplastic polymer capable of forming an optically anisotropic melt phase, and, in a cross-section of the thickness direction of the circuit board, the board structural body is covered with the cover film at an approximately uniform thickness.

In the cross-section of the thickness direction of the circuit board, the conductor circuit element preferably has an approximately rectangular shaped cross-section (hereinafter, abbreviated as a rectangular cross-section), and the cover film covers the conductor circuit element in a laterally equal manner.

For example, in the circuit board, when the rectangular cross-section of the conductor circuit element has a thickness t, the rectangular cross-section being provided with four corners of a board-side left end part, a board-side right end part, a cover film-side left end part, and a cover film-side right end part, and the cover film has a thickness t1 measured from the cover film-side left end part, a thickness t2 measured from the cover film-side right end part, and a thickness t3 measured from a cover film-side central part;

deviation of thickness (unit: %) of the cover film may satisfy the following formula (1):

$$[\mathrm{Max}(t1-t3)-\mathrm{Min}(t1-t3)]/t<30 \qquad (1)$$

wherein Max(t1–t3) is a maximum value among the thicknesses t1 to t3 of the cover film, Min(t1–t3) is a minimum value among the thicknesses t1 to t3 of the cover film, and "t" is the thickness of the conductor circuit element.

Furthermore, the conductor circuit element may include differential signal lines, and in this case, the board structural body is covered with the cover film at an approximately uniform thickness in the cross-section of the thickness direction of the circuit board.

For example, in this case where the conductor circuit element includes a first differential signal line and a second differential signal line, the two differential signal lines respectively have thicknesses $t_a$ and $t_b$ in rectangular cross-sections of the respective signal lines, the rectangular cross-sections of each of the differential signal lines being each provided with four corners of a board-side left end part, a board-side right end part, a cover film-side left end part, and a cover film-side right end part, the cover film has a thickness t1 measured from the cover film-side left end part of the first differential signal line, a thickness t2 measured from the cover film-side right end part of the first differential signal line, and a thickness t3 measured from a cover film-side central part of the first differential signal line, the cover film has a thickness t4 measured from the cover film-side left end part of the second differential signal line, a thickness t5 measured from the cover film-side right end part of the second differential signal line, and a thickness t6 measured from a cover film-side central part of the second differential signal line, and the cover film has a thickness t7 measured from a central part between the first and second differential signal lines;

deviation of thickness (unit: %) of the cover film may satisfy the following formula (2):

$$[\mathrm{Max}(t1-t7)-\mathrm{Min}(t1-t7)]/t<30 \qquad (2)$$

wherein Max(t1–t7) is a maximum value among the thicknesses t1 to t7 of the cover film, Min(t1–t7) is a minimum value among the thicknesses t1 to t7 of the cover film, and "t" is an average of the thicknesses $t_a$ and $t_b$ of the signal lines.

Preferably, a thermal expansion coefficient ac of the cover film may be within the range from −2 to +3 ($\times 10^{-6}$/° C.) with respect to a thermal expansion coefficient $\alpha_M$ of a conductor included in the conductor circuit element. Furthermore, an insulation material constituting the board may include a thermoplastic polymer capable of forming an optically anisotropic melt phase. Furthermore, the difference in dielectric constants between the insulation materials respectively constituting the board and the cover film is preferably within ±5%.

In addition, the present invention also includes a method of manufacturing such a circuit board, and the method comprises steps of:

preparing a board structural body including a board and a conductor circuit element disposed on at least one surface of the board; and covering a conductor circuit element on an outermost layer of the board structural body with a cover film;

wherein, in the covering step, the cover film comprising a film including a thermoplastic polymer capable of forming an optically anisotropic melt phase is melt-bonded to the board structural body by a heat treatment, the heat treatment is performed while having at least a release material interposed between the cover film and a heat-processing device, the release material is a laminate at least comprising, sequentially from the cover film to the heat-processing means, a low friction film selected from an ultrahigh-molecular-weight polyethylene film and a PTFE film, a first aluminum foil, a first high-density polyethylene film, a second high-density polyethylene film, and a second aluminum foil, and the first high-density polyethylene film and the second high-density polyethylene film are positioned such that respective MD directions are perpendicular to each other.

For example, each of the high-density polyethylene films may have a viscosity average molecular weight of about 20,000 to 500,000, and the ultrahigh-molecular-weight polyethylene film may have a viscosity average molecular weight of not lower than 1,000,000. Furthermore, the PTFE film may have an apparent melt viscosity at 380° C. of not lower than $10^{10}$ poise.

Furthermore, a thickness tc of the thermoplastic liquid crystal polymer film constituting the cover film is preferably larger than a thickness t of the conductor circuit element.

In the method of manufacturing a circuit board in which the conductor circuit element includes a first differential signal line and a second differential signal line, change in distance G between the first differential signal line and the second differential signal line before and after the covering step is preferably within 5%.

Furthermore, the present invention also includes a release material. The release material at least comprises:
a low friction film selected from the group consisting of an ultrahigh-molecular-weight polyethylene film and a PTFE film,
a first aluminum foil arranged on the low friction film,
a first high-density polyethylene film arranged on the first aluminum foil,
a second high-density polyethylene film arranged on the first high-density polyethylene film and positioned such that MD direction of the second high-density polyethylene film is perpendicular to MD direction of the first high-density polyethylene film, and
a second aluminum foil arranged on the second high-density polyethylene film.

It should be noted that, in the present invention, an approximately rectangular shape refers to a quadrangle whose all corners are approximately 90° (i.e., within the range of 88 to 92°, preferably 89 to 91°) including an overall rounded rectangle, a rectangle whose corner portions are rounded, etc.

Any combination of at least two constructions, disclosed in the appended claims and/or the specification and/or the accompanying drawings should be construed as included within the scope of the present invention. In particular, any combination of two or more of the appended claims should be equally construed as included within the scope of the present invention.

According to the present invention, since a board structural body can be covered with a liquid crystal polymer film at an approximately uniform thickness so as to obtain a circuit board, the circuit board not only is superior in heat resistance, water-vapor barrier property, chemical resistance, and electrical property, but also is highly reliable.

Furthermore, in the case where a conductor circuit can be covered with a cover film in an approximately laterally equal manner, the circuit board comprising a conductor circuit can maintain electrical properties (dielectric constant, dielectric loss tangent) in an excellent level as well as can suppress generation of noise.

Still further, in the case where a conductor circuit comprises differential signal lines, a circuit board with low loss and small noise can be attained at a low cost, so as to achieve both an excellent high speed signal property and a low cost.

In particular, in the case where a conductor circuit and a board can be covered with a cover film in an approximately laterally equal manner with a sufficient adherence, a circuit board with low loss and small noise can be attained at a low cost even if signal frequency employed is 1 Gbps or higher.

Furthermore, in the method of manufacturing of a circuit board of the present invention, a circuit board having the above described superior properties can be easily manufactured by a heat treatment with using a specific release material.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

FIG. 5 is a schematic cross-sectional view for describing a configuration of a release material used in Comparative Example 4.

DESCRIPTION OF EMBODIMENTS

Figure 1:
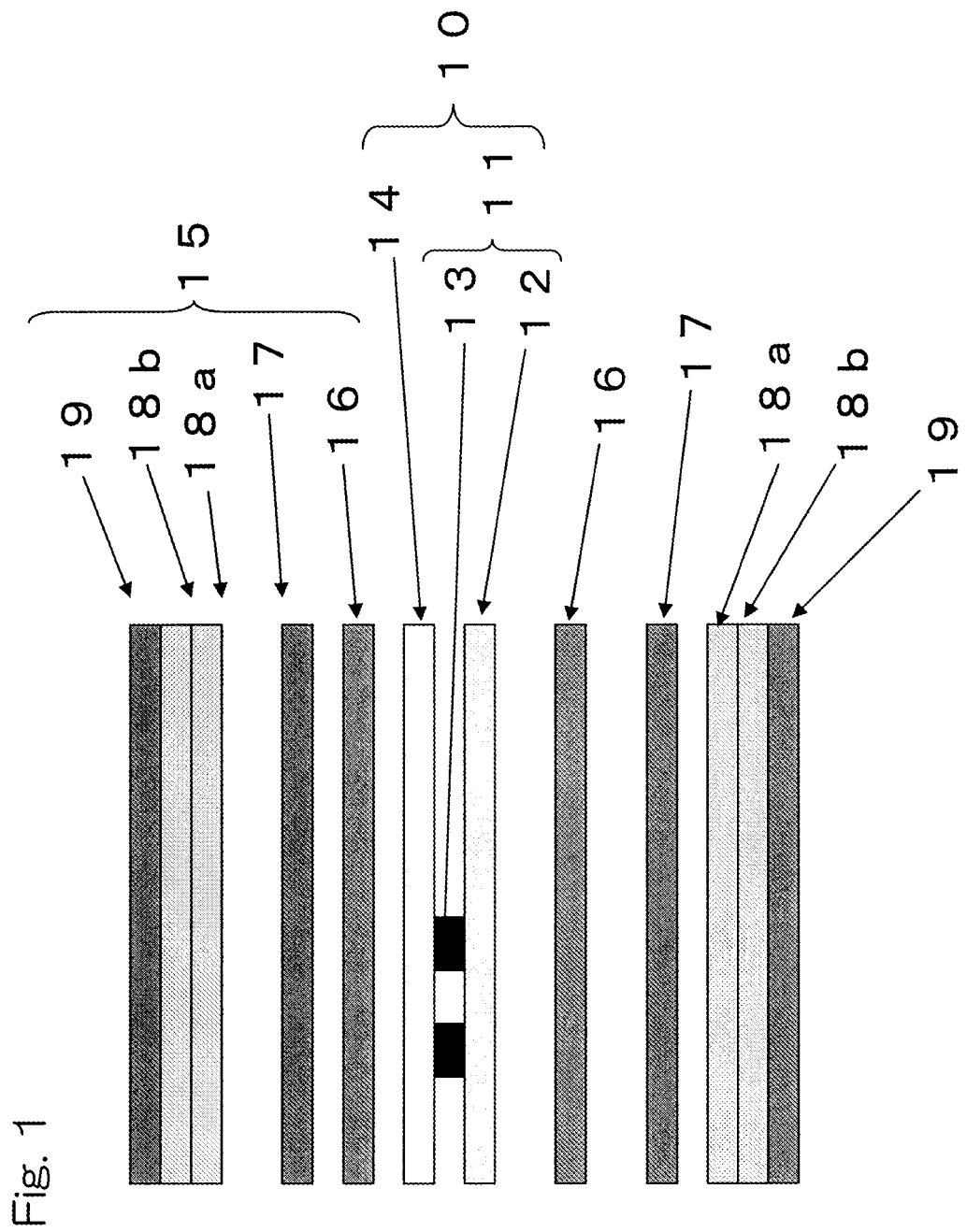
FIG. 1 is a schematic cross-sectional view for illustrating one example to show a covering step using a release material in a method of manufacturing a circuit board according to one embodiment of the present invention.

A circuit board of the present invention at least comprises: a board structural body including a board and a conductor circuit disposed on at least one surface of the board; and a cover film covering at least a conductor circuit side of outermost layers of the board structural body, wherein the board structural body is covered with the cover film at an approximately uniform thickness.

(Cover Film)

The cover film is formed from a thermoplastic liquid crystal polymer film.

The thermoplastic liquid crystal polymer film is formed from a liquid crystalline polymer processable in a molten state. In particular, chemical formulation of the thermoplastic liquid crystal polymer is not particularly limited to a specific one as long as it is a liquid crystalline polymer that can be melt-processable, and examples thereof may include a thermoplastic liquid crystal polyester, or a thermoplastic liquid crystal polyester amide obtained by introducing an amide bond thereto.

Furthermore, the thermoplastic liquid crystal polymer may be a polymer obtained by further introducing, to an aromatic polyester or an aromatic polyester amide, an imide bond, a carbonate bond, a carbodiimide bond, or an isocyanate-derived bond such as an isocyanurate bond.

Specific examples of the thermoplastic liquid crystal polymer used in the present invention may include known thermoplastic liquid crystal polyesters and thermoplastic liquid crystal polyester amides obtained from compounds classified as (1) to (4) as exemplified in the following, and derivatives thereof. However, it is needless to say that, in order to form a polymer capable of forming an optically anisotropic melt phase, there is a suitable range regarding the combination of various raw-material compounds.

(1) Aromatic or Aliphatic Dihydroxy Compounds (See Table 1 for Representative Examples)

TABLE 1

Chemical structural formulae of representative examples of aromatic or aliphatic dihydroxyl compounds

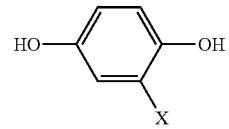

X represents a hydrogen atom or a halogen atom, or a group such as a lower alkyl (e.g., $C_{1-3}$ alkyl) or a phenyl TABLE 1-continued Chemical structural formulae of representative examples
of aromatic or aliphatic dihydroxyl compounds

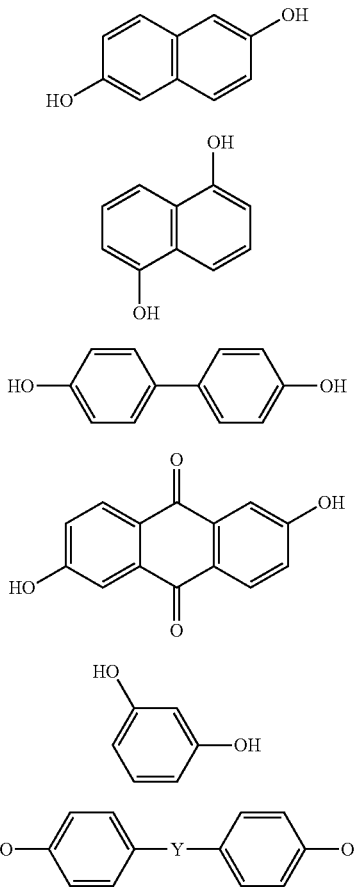

Y represents a group such as —O—, —CH$_2$—, —S—,
—CO—, —C(CH$_3$)$_2$—, or —SO$_2$—

HO(CH$_2$)$_n$OH
n is an integer of 2 to 12

(2) Aromatic or Aliphatic Dicarboxylic Acids (See Table 2 for Representative Examples)

TABLE 2

Chemical structural formulae of representative examples of
aromatic or aliphatic dicarboxylic acids

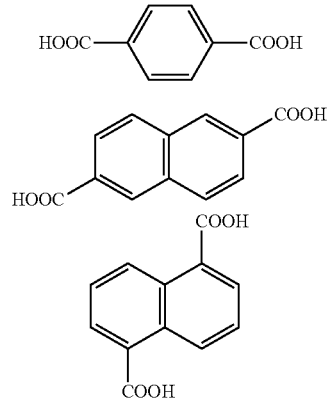

TABLE 2-continued

Chemical structural formulae of representative examples of
aromatic or aliphatic dicarboxylic acids

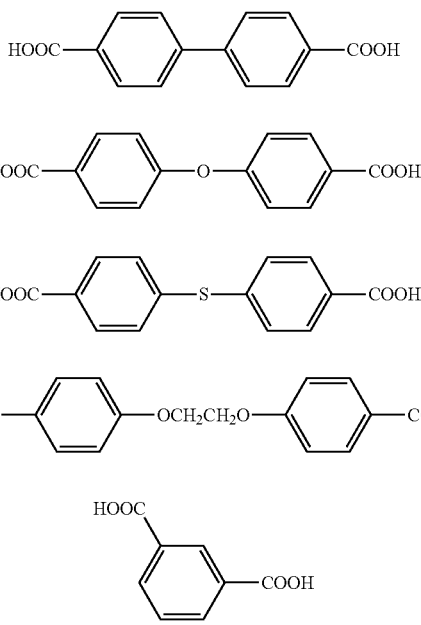

HOOC(CH$_2$)$_n$COOH
n is an integer of 2 to 12

(3) Aromatic Hydroxycarboxylic Acids (See Table 3 for Representative Examples)

TABLE 3

Chemical structural formulae of representative examples
of aromatic or aliphatic hydroxycarboxylic acids

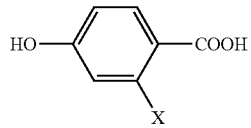

X represents a hydrogen atom or a halogen atom, or
a group such as a lower alkyl (e.g., C$_{1-3}$ alkyl) or a
phenyl

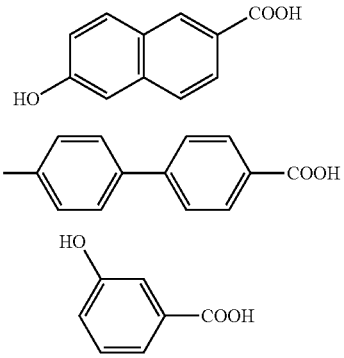

(4) Aromatic Diamines, Aromatic Hydroxy Amines, and Aromatic Aminocarboxylic Acids (See Table 4 for Representative Examples)

TABLE 4

Chemical structural formulae of representative examples of aromatic diamines, aromatic hydroxy amines, or aromatic aminocarboxylic acids

TABLE 4-continued

Chemical structural formulae of representative examples of aromatic diamines, aromatic hydroxy amines, or aromatic aminocarboxylic acids

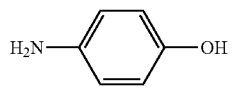

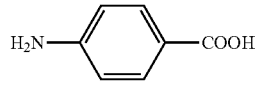

Representative examples of liquid crystal polymers obtained from these raw-material compounds may include copolymers having structural units shown in Tables 5 and 6.

TABLE 5

Representative examples (1) of a thermoplastic liquid crystal polymer

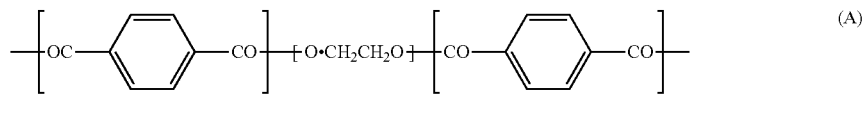

(A) Copolymer

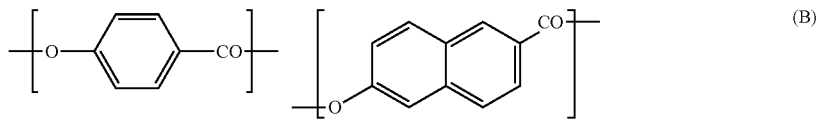

(B) Copolymer

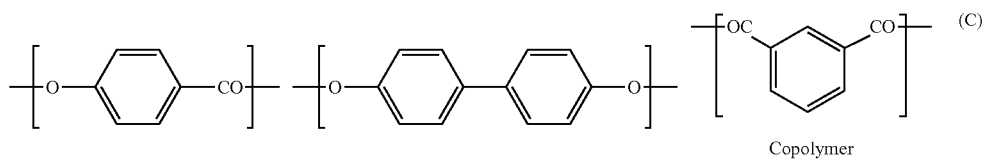

(C) Copolymer

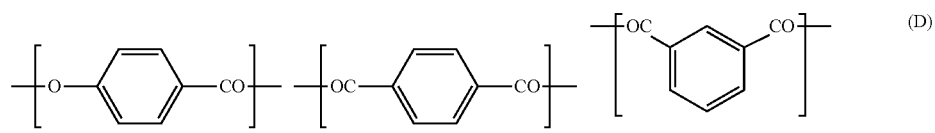

(D) Copolymer

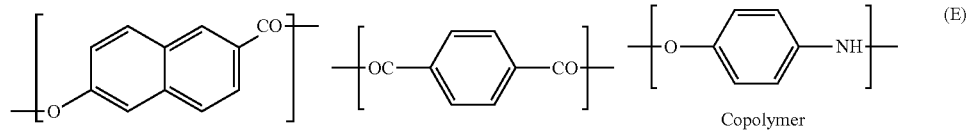

(E) Copolymer

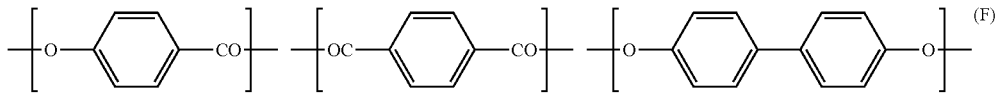

(F)

TABLE 5-continued

Representative examples (1) of a thermoplastic liquid crystal polymer

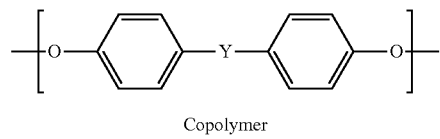

Copolymer

Y is a group such as —O—, —CH$_2$—, or —S—

TABLE 6

Representative examples (2) of thermoplastic liquid crystal polymer

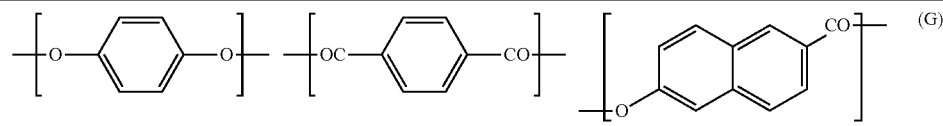

Copolymer (G)

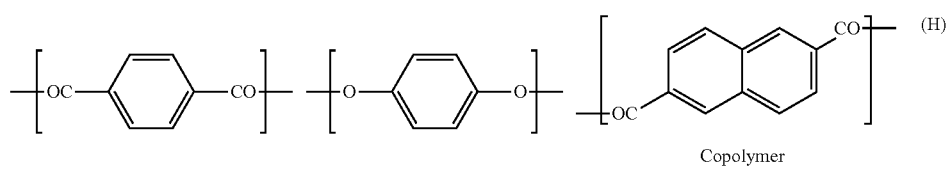

Copolymer (H)

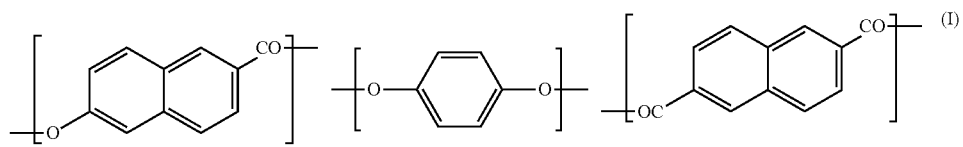

Copolymer (I)

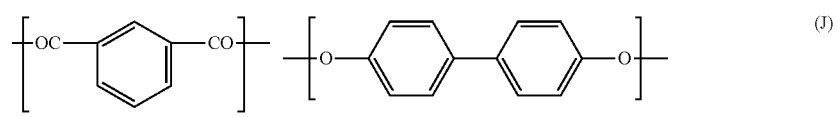

(J)

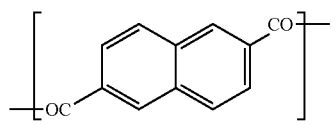

Copolymer

Of these copolymers, polymers including at least p-hydroxybenzoic acid and/or 6-hydroxy-2-naphthoic acid as repeating units are preferable; and particularly preferred polymers include:
  a polymer (i) having repeating units of p-hydroxybenzoic acid and 6-hydroxy-2-naphthoic acid, and
  a polymer (ii) having repeating units of
    at least one aromatic hydroxycarboxylic acid selected from a group consisting of p-hydroxybenzoic acid and 6-hydroxy-2-naphthoic acid,
    at least one aromatic diol selected from a group consisting of 4,4'-dihydroxybiphenyl and hydroquinone, and
    at least one aromatic dicarboxylic acid selected from a group consisting of terephthalic acid, isophthalic acid, and 2,6-naphthalene dicarboxylic acid.
For example, in the case where the polymer (i) comprises a thermoplastic liquid crystal polymer having repeating units of at least p-hydroxybenzoic acid (A) and 6-hydroxy-2-naphthoic acid (B), the liquid crystal polymer may have a mole ratio (A)/(B) of preferably about (A)/(B)=10/90 to 90/10, more preferably about (A)/(B)=50/50 to 85/15, and further preferably about (A)/(B)=60/40 to 80/20.

Furthermore, in the case where the polymer (ii) comprises a liquid crystal polymer having repeating units of at least one aromatic hydroxycarboxylic acid (C) selected from a group consisting of p-hydroxybenzoic acid and 6-hydroxy-2-naphthoic acid, at least one aromatic diol (D) selected from a group consisting of 4,4'-dihydroxybiphenyl and hydroquinone, and at least one aromatic dicarboxylic acid (E) selected from a group consisting of terephthalic acid, isophthalic acid, the liquid crystal polymer may have a mole ratio of aromatic hydroxycarboxylic acid (C):aromatic diol (D):aromatic dicarboxylic acid (E)=30 to 80:35 to 10:35 to 10, more preferably about (C):(D):(E)=35 to 75:32.5 to 12.5:32.5 to 12.5, and further preferably about (C):(D):(E)= 40 to 70:30 to 15:30 to 15.

Furthermore, the liquid crystal polymer may have a mole ratio of a repeating structural unit derived from an aromatic dicarboxylic acid (D) relative to a repeating structural unit derived from an aromatic diol (E) of preferably (D)/(E)=95/100 to 100/95. Deviation from this range may tend to result in a low degree of polymerization and deterioration in mechanical strength.

It should be noted that, in the present invention, optical anisotropy in a molten state can be determined by, for example, placing a sample on a hot stage, heating the sample with an elevating temperature under nitrogen atmosphere, and observing light transmitted through the sample.

As long as the advantageous effect of the present invention is not deteriorated, to the thermoplastic liquid crystal polymer, any thermoplastic polymer may be added such as a polyethylene terephthalate, a modified polyethylene terephthalate, a polyolefin, a polycarbonate, a polyarylate, a polyamide, a polyphenylene sulfide, a polyester ether ketone, and a fluorine resin.

A film of a thermoplastic liquid crystal polymer can be obtained by extrusion-molding of the thermoplastic liquid crystal polymer. Although any extrusion method may be used for this purpose, commonly known T-die method, inflation method and the like are industrially advantageous. In particular, the inflation method enables to apply stress not only in a machine direction (hereinafter, abbreviated as MD direction) of a film, but also in a transverse direction thereto (hereinafter, abbreviated as TD direction), it is possible to obtain a film that is well-balanced in thermal property and mechanical characteristics between the MD direction and the TD direction, and such film can be more suitably used.

The thermoplastic liquid crystal polymer film may have a melting point (hereinafter, sometimes referred to as Mp) in the range of 200 to 400° C., preferably in the range of 250 to 360° C., and further preferably in the range of 260 to 350° C. It should be noted that Mp can be obtained by measuring a temperature at which a main endothermic peak appears using a differential scanning calorimeter (DSC by Shimadzu Corp).

It should be noted that, when laminating a cover film to a board structural body by thermocompression bonding, the melting point Mp of the thermoplastic liquid crystal polymer cover film and the melting point of a material forming the board may either be approximately the same temperature with each other (e.g., a difference between Mp and the melting point of the material forming the board being within the range of −5° C. to +5° C.), or may be set to have a certain difference between the cover film and the board material. In a case where a difference is set therebetween and the board is thermocompressively bonded to the thermoplastic liquid crystal polymer cover film, the melting point (Mp) of the thermoplastic liquid crystal polymer film may be 15° C. or more lower than the melting point of the board material, and particularly 25° C. or more lower than the melting point of the board material.

It should be noted that, when higher heat resistance as well as higher melting point are required for a thermoplastic liquid crystal polymer film, it is possible to increase heat resistance and melting point by conducting a heat treatment on a film that has been already formed. As an example of conditions for the heat treatment, if an already-obtained film has a melting point of 283° C., that film can increase its melting point so as to have a melting point of 320° C. by conducting a heat treatment at a temperature of 260° C. for 5 hours.

Furthermore, although the required level of molecular orientation SOR of the thermoplastic liquid crystal polymer film is obviously varied depending on the field of application of the present invention, the film having an SOR of about 1.5 may be inflexible and easily torn in the MD direction due to significant deviation in the orientation of thermoplastic liquid crystal polymer molecules. A film having an SOR of not higher than 1.3 is preferable for printed wiring boards and multilayer printed wiring boards etc., requiring morphological stability which includes not having warping after being heated. In particular, a thermoplastic liquid crystal polymer film having an SOR of not higher than 1.3 has an excellent balance in terms of thermal property and mechanical characteristics between the MD direction and the TD direction so as to achieve even higher practical usefulness. Furthermore, a film having an SOR of not higher than 1.03 is preferable for precision-printed wiring boards and multilayer printed wiring boards etc., requiring an almost complete elimination of warping after being heated.

Here, the molecular orientation level SOR (Segment Orientation Ratio) is an index descriptive of a degree of molecular orientation, and represents, unlike the standard MOR (Molecular Orientation Ratio), a value that takes into consideration the thickness of an object. The molecular orientation level SOR indicates a value measured using a method set forth in Examples described later.

In the present invention, a thermal expansion coefficient of the thermoplastic liquid crystal polymer film used as a cover film can be appropriately set depending on the type of circuit board, and, for example, a thermal expansion coefficient $\alpha_C$ of the thermoplastic liquid crystal polymer film relative to a thermal expansion coefficient $\alpha_M$ of the conductor included in the conductor circuit may be within the range of −2 to +3 ($\times 10^{-6}$/° C.), i.e., $\alpha_M - 2 \leq \alpha_C \leq \alpha_M + 3$ ($\times 10^{-6}$/° C.), and more preferably within the range of −1 to +2 ($\times 10^{-6}$/° C.), i.e., $\alpha_M - 1 \leq \alpha_C \leq \alpha_M + 2$ ($\times 10^{-6}$/° C.).

It should be noted that the thermal expansion coefficient $\alpha_C$ of the thermoplastic liquid crystal polymer film can be set to a predetermined value by conducting a heat treatment. This heat treatment may be performed either before bonding the cover film and the board on which the conductor circuit is formed, or after bonding the cover film to the board. There is no particular limitation in the devices used for the heat treatment, and, examples thereof may include a circulating hot air oven, a heated roll, a ceramic heater, a heat press, and the like.

A thickness (tc) of the thermoplastic liquid crystal polymer film constituting the cover film can be appropriately determined depending on a thickness (t) of the conductor circuit element, and is not particularly limited to a specific one. However, from a viewpoint of uniformly covering the whole board structural body, t<tc is preferable, t×1.1≤tc is more preferable, and t×1.5≤tc is further preferable. Furthermore, from a viewpoint of improving flexibility of the circuit board, tc≤t×4 is preferable.

(Board Structural Body)

It is sufficient that the board structural body may include a board and a conductor circuit element disposed on at least one surface of the board. The conductor circuit element may be formed on one surface of the board, or may be formed on both surfaces of the board. Furthermore, the board structural body may include a plurality of boards. Specific examples of the board structural body may include printed wiring boards, flexible printed wiring boards, multilayer printed wiring boards, and others.

In particular, the board structural body may preferably include differential signal lines as a conductor circuit element. A differential signal is used in a method of transmitting a single signal using two signal lines, and identification of "H" level and "L" level is conducted depending on whether voltage between differential signal lines is positive (+) or negative (−). In this method, a voltage difference between two signal lines can cancel noise incorporated in these lines and can accomplish a differential signal resistant to noise compared to a single-ended signal. In this way, high-speed transmission of data can be achieved. For example, such differential signal lines can be used for high-speed interfaces such as PCI Express buses and USBs.

The board structural body may be obtained by a step of preparing a board structural body including a board and a conductor circuit element disposed on at least one surface of the board. The board structural body preparing step may include a board preparing step of preparing a board, and a circuit formation step of forming a conductor circuit element on at least one surface of the board.

The board may be either a monolayer board including a conductor circuit element on at least one surface thereof, or a multilayer board obtained by laminating a plurality of the monolayer boards as a multilayer. There is no particular limitation in an insulation material forming the board, and examples thereof may include epoxy-based materials, bis-maleimide-based materials, polyimide-based materials, and polyester-based and/or polyester amide-based materials including thermoplastic liquid crystal polymers.

Among these, the insulation material forming the board preferably includes a thermoplastic liquid crystal polymer that is superior in electrical property, low water-absorbency, heat resistance, and dimensional stability, etc. There is no particular limitation in the thermoplastic liquid crystal polymer forming a board as well as used as a cover film; and, from a viewpoint of obtaining excellent adhesive property, the thermoplastic liquid crystal polymer forming the board preferably has the same chemical formulation with the thermoplastic liquid crystal polymer forming the cover film.

When the thermoplastic liquid crystal polymer film is used as a board, difference in dielectric constants of the thermoplastic liquid crystal polymer films forming each of the cover film and the board is desirably within 5%, and is preferably within 2%.

Here, difference in dielectric constants is represented as |PB−Pc|/PB expressed as percentage, wherein Pc represents a dielectric constant of the cover film and PB represents a dielectric constant of the board.

In particular, when the conductor circuit is a differential circuit, an electric field formed between differential signal lines is concentrated between differential wires, and a dielectric body disposed between the differential wires largely contributes to dielectric loss of differential signals. Therefore, if the difference in dielectric constants between the board and the liquid crystal polymer film used as a cover film is small, disequilibrium in electric field on the top and bottom is unlikely to occur, and it becomes possible to prevent distortion of signals and reduce transmission loss.

The conductor circuit element (or conductive body) is formed on at least one surface of the board, and includes signal lines formed in a predetermined pattern. Such a conductor element may be formed in accordance with a known or commonly used method, such as sputtering method, plating method, and the like. Furthermore, the signal lines formed in a predetermined pattern may be formed on one surface of the thermoplastic liquid crystal polymer film by, for example, laminating a conductor sheet on the thermoplastic liquid crystal polymer film using a method known in the art or commonly used such as thermocompression bonding, and then by performing thereon a photosensitive resist process, exposure, and an etching process.

It should be noted that, a preferable conductor includes a metal used for electric connection, such as copper, gold, silver, nickel, aluminum, etc. Although any copper foil can be used regardless of a manufacturing method such as a rolling method, an electrolysis method, or the like, preferable one includes a copper foil manufactured by the electrolysis method and has a large surface roughness. On a metallic foil, a chemical treatment such as acid washing ordinarily provided to a copper foil may be provided. Among those metals, copper is preferably used.

The thickness of the conductor (or conductive body) covered with the cover film may be appropriately determined depending on the type of the circuit board and role thereof in the circuit board; and, for example, the thickness may be set within the range of 1 to 150 μm, preferably within the range of 5 to 100 μm, and more preferably within the range of 10 to 80 μm.

The circuit board of the present invention can be obtained by covering at least a conductor circuit side of a board structural body with a cover film. In the covering step, the cover film is fused and bonded to the board structural body by a heat treatment. The heat treatment is performed while having at least a release material interposed between the cover film and a heat-processing device.

FIG. 1 is a schematic cross-sectional view for illustrating one example to show a covering step using a release material. In a cross-section of the thickness direction of a circuit board 10, a board structural body 11 includes a board 12 and a plurality of conductors 13 and 13 arranged on a top surface of the board 12. In the covering step shown in FIG. 1, a liquid crystal polymer film 14 used as a cover film is overlaid on the board structural body 11 on a side of the conductors 13, and the layered board structural body 11 and liquid crystal polymer film 14 are heated by heat-processing devices such as a heat press machine through release materials 15 and 15 to form the circuit board 10.

The release material 15 at least includes, sequentially from the circuit board 10 toward the outer side, an ultrahigh-molecular-weight polyethylene film 16 as a low friction film, a first aluminum foil 17, a first high-density polyethylene film 18a, a second high-density polyethylene film 18b, and a second aluminum foil 19. Here, the first high-density polyethylene film 18a and the second high-density polyethylene film 18b are positioned such that respective MD directions are perpendicular to each other. It should be noted that, as a low friction film, a PTFE film may be used instead of the ultrahigh-molecular-weight polyethylene film.

In FIG. 1, when covering the conductor circuit elements 13 and 13 disposed on one surface of the board 12 with the liquid crystal polymer film 14, the covering step is conducted using the release materials 15 and 15 on both surfaces of the circuit board 10. However, the release material may be appropriately used in accordance with the kinds of heating devices, and, for example, in the configuration in FIG. 1, the covering step may be conducted using the release material 15 only on one side of the liquid crystal polymer film 14. Furthermore, although not diagrammatically represented, the conductor circuit element 13 may be formed on both surfaces of the board 12, or a modification may be made as appropriate based on technical common knowledge for those skilled in the art.

The low friction film included in the release material can be a film having a low friction coefficient, i.e., a coefficient of static friction, defined by JIS K 7125, of not larger than 0.30 (preferably, about 0.05 to 0.25); and specific examples thereof may include an ultrahigh-molecular-weight polyethylene film, a PTFE film, and the like.

For example, the ultrahigh-molecular-weight polyethylene film may have a coefficient of static friction of about 0.10 to 0.25, and its viscosity average molecular weight may be, for example, not lower than 1,000,000, preferably about 2,000,000 to 7,000,000, and further preferably about 3,000,000 to 6,000,000. It should be noted that, with regard to a method of measuring limiting viscosity number used for calculating a viscosity average molecular weight, measurements can be conducted in a manner conforming to JIS K7367-3: 1999.

Furthermore, the PTFE film may have a coefficient of static friction of about 0.08 to 0.12, and its melt viscosity at 380° C. may be not lower than $10^{10}$ poise, and may be preferably within the range of $10^{10}$ to $10^{11}$ poise.

Furthermore, the viscosity average molecular weight of the high-density polyethylene film included in the release material may be, for example, 20,000 to 500,000, preferably about 50,000 to 300,000, and further preferably about 100,000 to 200,000. In addition, the high-density polyethylene film may be evaluated using melt flow index instead of the viscosity average molecular weight, and the melt flow index of the high-density polyethylene film may be, for example, about 0.03 to 0.08, and preferably about 0.04 to 0.06. With regard to a method for measuring the melt flow index, measurements can be conducted in a manner conforming to JIS K7210.

By conducting the heat treatment using such a release material, the board structural body can be covered with the cover film in the state that the film has an approximately uniform thickness after covering step. Furthermore, the board structural body can be covered with the cover film without deforming the conductor circuit structure formed in advance on the board structural body.

In addition, the cover film may cover the board structural body without gaps, and bonding strength between the cover film and the board structural body may be, for example, about 0.4 to 3.0 kN/m, preferably about 0.5 to 2.5 kN/m, and more preferably about 0.6 to 1.5 kN/m. Here, the bonding strength is a value measured with a method set forth in a later described section of Examples.

Figure 2:
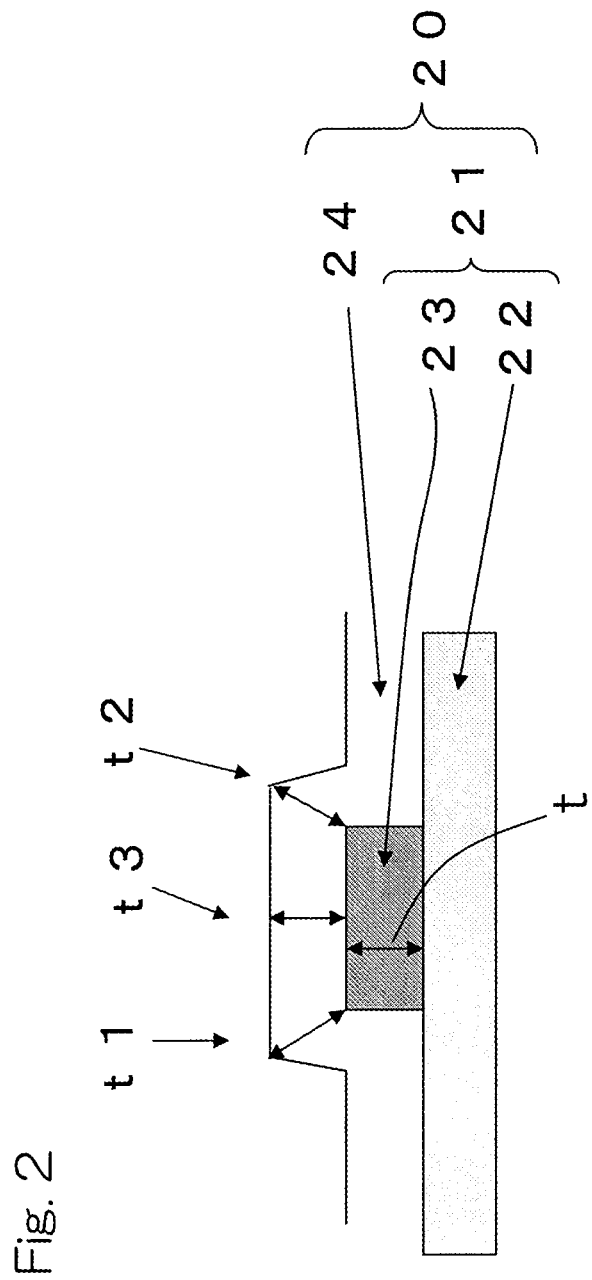
FIG. 2 is a schematic cross-sectional view showing a circuit board according to one embodiment of the present invention.

FIG. 2 is a schematic cross-sectional view showing a circuit board 20 according to one embodiment of the present invention. The circuit board 20 includes, in a cross-section of the thickness direction of the circuit board 20, a board structural body 21 including a board 22 and a conductor circuit element 23 arranged thereon, and a cover film 24 coating the board structural body 21 on a side of the conductor circuit element 23. The conductor circuit element 23 has an approximately rectangular shaped cross-section, and the cover film 24 covers the conductor circuit element 23 having an approximately rectangular shaped cross-section in a laterally equal manner. It should be noted that, although not diagrammatically represented, a ground plane may be arranged on the circuit board 20 if necessary.

FIG. 2 shows a schematic cross-sectional view of a circuit board for describing the state in which the cover film 24 is covering the conductor circuit element 23 having an approximately rectangular shaped cross-section in a laterally equal manner. As shown in FIG. 2, the rectangular cross-section of the conductor circuit element 23 has a thickness t, and the rectangular cross-section is provided with four corners of a board-side left end part, a board-side right end part, a cover film-side left end part, and a cover film-side right end part. The thickness of the cover film measured from the cover film-side left end part is t1, the thickness of the cover film measured from the cover film-side right end part is t2, and the thickness of the cover film measured from the cover film-side central part is t3. It should be noted that the thicknesses t1 to t3 are each measured with a method described in detail in the section of Examples.

When the cover film 24 covers the conductor circuit element 23 having an approximately rectangular cross-section in a laterally equal manner, a deviation of thickness (unit: %) of the cover film 24 may be, for example, lower than 30%, thus, satisfying formula (1) below:

$$[\text{Deviation of Thickness}] = [\text{Max}(t1-t3) - \text{Min}(t1-t3)]/t < 30 \qquad (1)$$

(In the formula, Max(t1–t3) is a maximum value among the thicknesses t1 to t3 of the cover film, Min(t1–t3) is a minimum value among the thicknesses t1 to t3 of the cover film, and "t" is the thickness of the conductor circuit element.)

Figure 3:
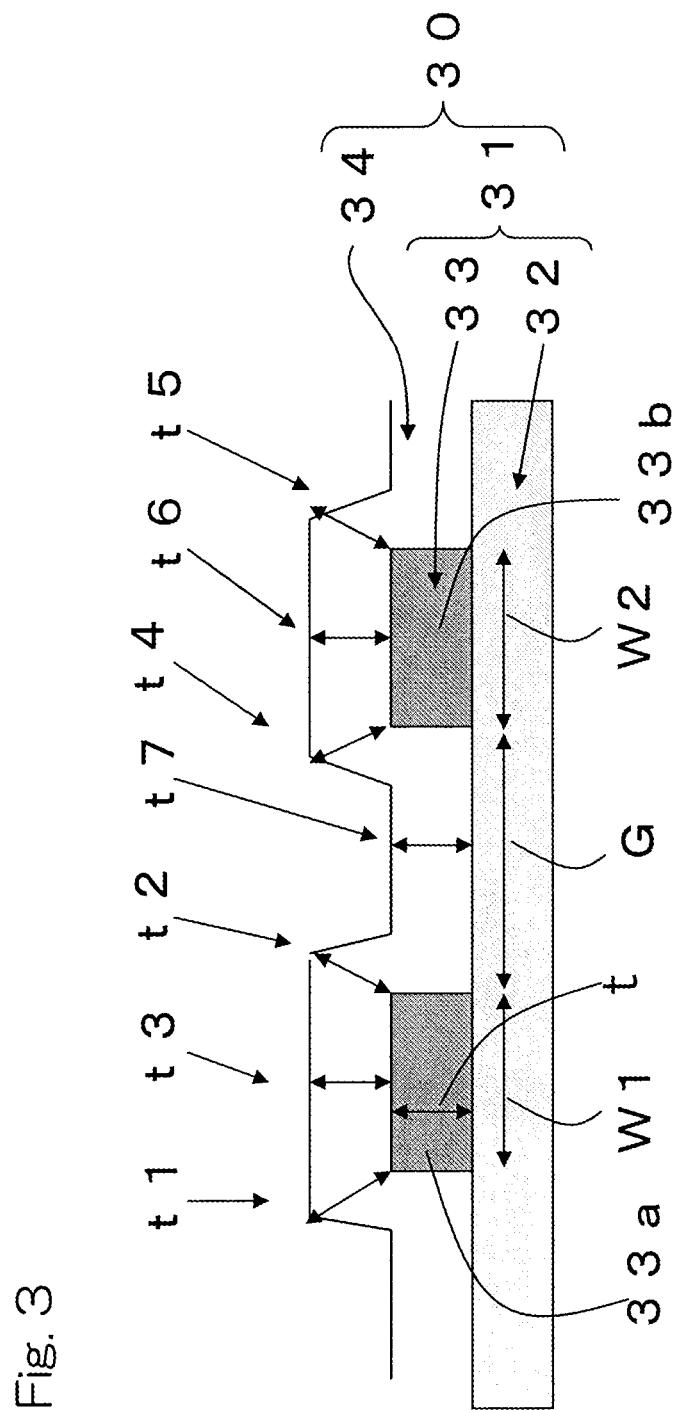
FIG. 3 is a schematic cross-sectional view showing a circuit board according to another embodiment of the present invention.

FIG. 3 is a schematic cross-sectional view showing a circuit board 30 according to another embodiment of the present invention. The circuit board 30 includes a board structural body 31 including a board 32 and a conductor circuit element 33 arranged thereon, and a cover film 34 covering the board structural body 31 on a side of the conductor circuit element 33. The conductor circuit element 33 is a differential wiring circuit including a first differential signal line 33a and a second differential signal line 33b. In the cross-section of the thickness direction of the circuit board 30, the board structural body 31 is covered with the cover film 34 at an approximately uniform thickness.

Furthermore, as shown in FIG. 3, the two differential signal lines 33a and 33b both have a thickness t in respective rectangular cross-sections of the signal lines. It should be noted that, when the thicknesses of the two differential signal lines 33a and 33b are different, an average of respective thicknesses $t_a$ and $t_b$ may be used as the thickness t. Furthermore, each of the rectangular cross-sections is provided with four corners of a board-side left end part, a board-side right end part, a cover film-side left end part, and a cover film-side right end part.

In this case, in the first differential signal line, the thickness of the cover film measured from the cover film-side left end part is t1, the thickness of the cover film measured from the cover film-side right end part is t2, and the thickness of the cover film measured from the cover film-side central part is t3.

Furthermore, in the second differential signal line, the thickness of the cover film measured from the cover film-side left end part is t4, the thickness of the cover film measured from the cover film-side right end part is t5, and the thickness of the cover film measured from the cover film-side central part is t6.

Furthermore, a thickness of the cover film measured from a central part between the first and second differential signal lines is t7. Still further, a distance between the first differential signal line 33a and the second differential signal line 33b is represented as "G." It should be noted that the inter differential-signal-line distance G and the thicknesses t1 to t7 are each measured with a method described in detailed in the section of Examples.

When the cover film 34 covers the board structural body 31 having an approximately rectangular cross-section in a laterally equal manner, the deviation of thickness (unit: %) of the cover film 34 may be, for example, lower than 30%, thus, satisfying formula (2) below:

$$[\text{Deviation of Thickness}] = [\text{Max}(t1-t7) - \text{Min}(t1-t7)]/t < 30 \quad (2)$$

(In the formula, Max(t1–t7) is a maximum value among the thicknesses t1 to t7 of the cover film, Min(t1–t7) is a minimum value among the thicknesses t1 to t7 of the cover film, and "t" is the thickness of the conductor circuit element.)

Furthermore, from a viewpoint of maintaining pattern design of the conductor circuit that has already been disposed on the board structural body, change in distance G between differential signal lines before and after covering is preferably within 5%, more preferably within 3%, and particularly preferably within 2%.

It should be noted that, the change in inter differential-signal-line distance G is represented as |Gb−Ga|/Ga expressed as percentage, wherein Ga represents the distance before covering and Gb represents the distance after covering.

Since the circuit board of the present invention includes a thermoplastic liquid crystal polymer film used as a cover film, the circuit board has low hygroscopicity and superior heat resistance and chemical resistance, and the board structural body can be covered with the cover film at an approximately uniform thickness. Therefore, a highly reliable wiring board can be obtained.

In particular, with the circuit board of the present invention, even when signals transmitted therein are increased in frequency and in speed, since the board structural body can be covered with the cover film in an approximately laterally equal manner and in a state suppressing deformation of the conductor circuit, the circuit board is hardly affected by noise so as to make it possible not only to suppress deterioration in transmission property (EMI property) but also to achieve impedance matching at a portion connecting to the board without altering impedance that has been pattern-designed.

In particular, since a cover film is formed from a thermoplastic liquid crystal polymer, even if the circuit board is placed under a high temperature and high humidity environment, it is possible to suppress increase in transmission loss of the circuit board.

EXAMPLES

In the following, although the present invention will be described in more detail by means of Examples, the present invention is not limited to these Examples in any way. It should be noted that, in the following Examples and Comparative Examples, various physical properties were measured with the method described below.

[Melting Point]

Using a differential scanning calorimeter, the thermal behavior of the film was observed to determine the melting point. More specifically, a test film was heated at a rate of 20° C./min to be completely melted, and then, a position of an endothermic peak that had appeared when temperature was raised at a rate of 20° C./min was recorded as a melting point of the film.

[Film Thickness]

Film thicknesses of an obtained film were measured at intervals of 1 cm in the TD direction using a digital thickness meter (manufactured by Mitutoyo Corp.), and the film thickness is represented by the average value of arbitrarily chosen 10 film thicknesses selected from a center portion and end portions.

[Bonding Strength]

A test piece for peel-testing having a width of 1.0 cm was produced from a laminated body of a board structural body and a cover film. The layer of the cover film was then fixed to a flat plate by a double-sided adhesive tape, and the bonding strength (kN/m) at which the board structural body was peeled at a rate of 50 mm/min was measured using a 90° method in accordance with JIS C 5016.

[Transmission Loss/Impedance]

By using a microwave network analyzer ("8722ES" manufactured by Agilent Technologies Inc.) and a probe (ACP40-250) manufactured by Cascade Microtech Inc., transmission loss and impedance were measured at 0 to 40 GHz. It should be noted that, transmission loss was measured both immediately after leaving a circuit board for 96 hours at a temperature of 23° C. and humidity of 60% (RH), and immediately after leaving it for 96 hours at a temperature of 60° C. and humidity of 90% (RH).

[Deviation of Thickness and Inter Differential-Signal-Line Distance G]

By using a profile measuring microscope (VK-810) manufactured by KEYENCE Corp., at a measurement magnification (×1000), thicknesses (t1 to t7) of the cover film in the circuit board and thickness (t) of the conductor circuit element were measured in the following manner to calculate a deviation of thickness of the cover film. In addition, the distance G between differential signal lines was also measured.

FIG. 3 will be utilized for describing the method of measuring a circuit board in the thickness direction. The circuit board 30 includes the board 32 and the conductor circuit element 33 consisting of two differential signal lines arranged on the board 32, and the cover film 34 arranged thereon. The two differential signal lines 33*a* and 33*b* both have a thickness t in a rectangular cross-section of each of their signal lines, and each of the rectangular cross-sections of the differential signal lines is provided with four corners of a board-side left end part, a board-side right end part, a cover film-side left end part, and a cover film-side right end part.

Here, with regard to the thicknesses (t1 to t7) of the cover film, thicknesses of the cover film on the first differential signal line are described hereinafter. A thickness of the cover film measured in a direction 45° obliquely upward to the left from the cover film-side left end part through the cover film is represented as t1, a thickness of the cover film measured in a direction 45° obliquely upward to the right from the cover film-side right end part through the cover film is represented as t2, and a thickness of the cover film measured vertically upward from the cover film-side central part is represented as t3.

Further, thicknesses of the cover film on the second differential signal line are described hereinafter. A thickness of the cover film measured in a direction 45° obliquely upward to the left from the cover film-side left end part through the cover film is represented as t4, a thickness of the cover film measured in a direction 45° obliquely upward to the right from the cover film-side right end part through the cover film is represented as t5, and a thickness of the cover film measured vertically upward from the cover film-side central part is represented as t6.

Furthermore, a thickness of the cover film measured vertically upward from the central part between the first and second differential signal lines is represented as t7. It should be noted that, here, the widths of the first and second differential signal lines are respectively represented as W1 and W2, and a distance between the first and second differential signal lines is represented as "G."

By using the measured thicknesses (t1 to ti) of the cover film in the circuit board and the thickness (t) of the conductor circuit element, a deviation of thickness is calculated from formula (3) below:

[Deviation of Thickness]=[Max(t1−ti)−Min(t1−ti)]/t     (3)

(In the formula, Max(t1−ti) is a maximum value among the thicknesses t1 to ti of the cover film, Min(t1−ti) is a minimum value among the thicknesses t1 to ti of the cover film, "i" is an integer of 1 to 7, and "t" is the thickness of the conductor circuit element.)

A deviation of thickness not higher than 5% was evaluated as A, a deviation of thickness higher than 5% but lower than 30% was evaluated as B, and a deviation of thickness not lower than 30% was evaluated as C.

[Dielectric Property]

Dielectric constant measurement was conducted using a dielectric-material measuring device (manufactured by Kanto Electronic Application and Development Inc.) by a resonant cavity perturbation method at a frequency of 10 GHz. With regard to the method of measuring dielectric constant by the perturbation method, a minute material (width: 2.7 mm×length: 45 mm) was inserted in a resonant cavity, and the dielectric constant of the material was measured from the change of resonance frequency before and after the material had been inserted therein for 96 hours at a temperature of 20° C. and humidity of 65% (RH).

[Thermal Expansion Coefficient of Film]

The thermal expansion coefficient is defined as a coefficient obtained by dividing a degree of thermal expansion of a film by a temperature difference, when a heat was applied at a constant temperature raising rate from a room temperature to a temperature around a thermal deformation temperature of the film. The thermal expansion coefficient is calculated in the following manner.

First, by using a known apparatus for thermomechanical analysis, one end of a film cut into a thin-strip form was fixed, and allowed to apply a tensile load at the opposite end to measure an expansion amount when heated at a constant heating rate. By way of example, assuming that the film strip has a length $L_0$ (mm) as measured in a direction in which the tensile load is applied and a length $L_1$ (mm) as measured when heated, and that the room temperature and the heating temperature are expressed by T1 (° C.) and T2 (° C.), respectively, a linear expansion coefficient α can be calculated with the following formula:

α=[($L_1-L_0$)/($T_2-T_1$)]/$L_0$(×$10^{-6}$/° C.)

It should be noted that, in the present invention, $L_0$=20 mm, $T_2$=150° C., $T_1$=25° C., and a tension load of 1 g were used.

[Molecular Orientation Level (SOR)]

Using a microwave molecular orientation degree measuring machine, a liquid crystal polymer film is inserted into a microwave resonance waveguide tube such that a propagation direction of microwave becomes perpendicular to the film surface, and electric-field strength (microwave transmission intensity) of microwave transmitted through the film was measured.

Then, based on this measured value, m value (referred to as refractive index) is calculated from the following formula:

m=($Z_o/\Delta z$)×[1−vmax/vo]

Here, Zo represents a device constant, ΔZ represents an average thickness of an object subjected to the measurement, vmax represents the frequency at which the maximum microwave permeability can be obtained when the frequency of the microwave is varied, and vo represents the frequency at which the maximum microwave permeability can be obtained when the average thickness is zero, that is, when no object is present.

Next, when the angle of rotation of the object relative to the direction of oscillation of the microwaves is 0°, that is, when the direction of oscillation of the microwaves is aligned with the direction in which molecules of the object are most oriented and in which the minimum microwave penetration strength is exhibited, an m value obtained in such a case was represented as $m_0$. An m value obtained as $m_{90}$ represents the value of the refractive index when the angle of rotation of the object is 90°. A molecular orientation level SOR is calculated as $m_0/m_{90}$.

Reference Example 1

A copolymerization product of p-hydroxybenzoic acid and 6-hydroxy-2-naphthoic acid (mole ratio: 73/27) was melted and extruded, and a thermoplastic liquid crystal polymer film (A) having a melting point of 280° C., a film thickness of 25 μm, an SOR of 1.05, and a dielectric constant of 3.0 was obtained by inflation method.

Reference Example 2

A copolymerization product of p-hydroxybenzoic acid and 6-hydroxy-2-naphthoic acid (mole ratio: 73/27) was melted and extruded, and, a film having a melting point of 280° C., a film thickness of 50 μm, and an SOR of 1.05 was obtained by inflation method. By applying heat to this film as a heat treatment for 7 hours at 260° C., a thermoplastic liquid crystal polymer film (B) having a melting point of 335° C., a film thickness of 50 μm, a molecular orientation level SOR of 1.05, and a dielectric constant of 3.0 was obtained.

Reference Example 3

An electrolytic copper foil having a thickness of 18 Cpm was overlaid on one surface of the thermoplastic liquid crystal polymer film (B), and thermocompression bonding was conducted using a vacuum hot press apparatus under a condition of a temperature of 330° C. and a pressure of 30 kg/cm² to produce a laminated body of the thermoplastic liquid crystal polymer film and the copper foil.

Then, a resist film was coated on the copper foil, and regions of the copper foil on which the resist film had not been formed were dissolved and removed using a copper(II) chloride solution as an etching solution to produce a board having a differential signal wiring pattern on the thermoplastic liquid crystal polymer film. The differential signal wiring pattern was formed as shown in FIG. 3, and, in order to have a differential impedance of 100Ω, a circuit was produced so as to have widths of W1 and W2 each having 100 μm, an inter differential-signal-line distance G of 80 μm, and a length of each signal line of 100 mm in the longitudinal direction as shown in FIG. 3.

Reference Example 4

In a manner similar to Reference Example 1 except for setting the film thickness to 50 μm, a thermoplastic liquid crystal polymer film (C) having a melting point of 280° C., a molecular orientation level SOR of 1.05, and a dielectric constant of 3.0 was produced.

Example 1

The thermoplastic liquid crystal polymer cover film (A) produced in Reference Example 1 was placed on the disposed wiring pattern of the board produced in Reference Example 3, and thermocompression bonding was conducted thereon with release materials having a configuration (1) shown in FIG. 1, using a vacuum hot press apparatus under a condition of a temperature of 290° C. and a pressure of 20 kg/cm². The results are shown in Table 7.

It should be noted that the release material shown in FIG. 1 includes: an ultrahigh-molecular-weight polyethylene film 16 ("NEWLIGHT NL-W" manufactured by Saxin Corp., having a thickness of 50 μm, a viscosity average molecular weight of 5,000,000, and a coefficient of static friction of 0.14) as a low friction film; a first aluminum foil 17 ("IN50" manufactured by Sumikei Aluminum Foil Co., Ltd., having a thickness of 50 μm) arranged on the ultrahigh-molecular-weight polyethylene film 16; a first high-density polyethylene film 18a ("HD film" manufactured by Okura Industrial Co., Ltd., having a thickness of 50 μm and a melt flow index of 0.05) arranged on the first aluminum foil 17; a second high-density polyethylene film 18b arranged on the first high-density polyethylene film 18a; and a second aluminum foil 19 ("IN50" manufactured by Sumikei Aluminum-Foil Co., Ltd., having a thickness of 50 μm) arranged on the second high-density polyethylene film 18b. These are arranged from the circuit board toward the heat-processing apparatus in an order from the ultrahigh-molecular-weight polyethylene film 16 to the second aluminum foil 19. It should be noted that the first high-density polyethylene film and the second high-density polyethylene film are films of the same type, and are laminated such that respective MD directions are perpendicular to each other.

Example 2

The thermoplastic liquid crystal polymer cover film (C) produced in Reference Example 4 was placed on the arrangement of the wiring pattern of the board produced in Reference Example 3, and thermocompression bonding was conducted thereon with the release materials having the configuration shown in FIG. 1, using the vacuum hot press apparatus under a condition of a temperature of 290° C. and a pressure of 20 kg/cm². The results are shown in Table 7.

Example 3

In a manner similar to Example 1 except for using a release material having the configuration (1) shown in FIG. 1 comprising a PTFE film ("NITOFLON 900UL" manufactured by NITTO DENKO Corp., having a thickness of 50 μm and a coefficient of static friction of 0.12) instead of the ultrahigh-molecular-weight polyethylene film as a low friction film; the thermoplastic liquid crystal polymer cover film (A) produced in Reference Example 4 was placed on the disposed wiring pattern of the board produced in Reference Example 3, and thermocompression bonding was conducted thereon using the vacuum hot press apparatus under a condition of a temperature of 290° C. and a pressure of 20 kg/cm². The results are shown in Table 7.

Example 4

The thermoplastic liquid crystal polymer cover film (B) produced in Reference Example 2 was placed on the disposed wiring pattern of the board produced in Reference Example 3, and thermocompression bonding was conducted thereon with the release materials having the configuration (1) shown in FIG. 1 using the vacuum hot press apparatus under a condition of a temperature of 310° C. and a pressure of 20 kg/cm². The results are shown in Table 7.

Example 5

The thermoplastic liquid crystal polymer cover film (B) produced in Reference Example 2 was placed on the disposed wiring pattern of the board produced in Reference Example 3, and thermocompression bonding was conducted thereon with release materials similar to those in Example 3 using the vacuum hot press apparatus under a condition of a temperature of 310° C. and a pressure of 20 kg/cm². The results are shown in Table 7.

Comparative Example 1

Figure 4:
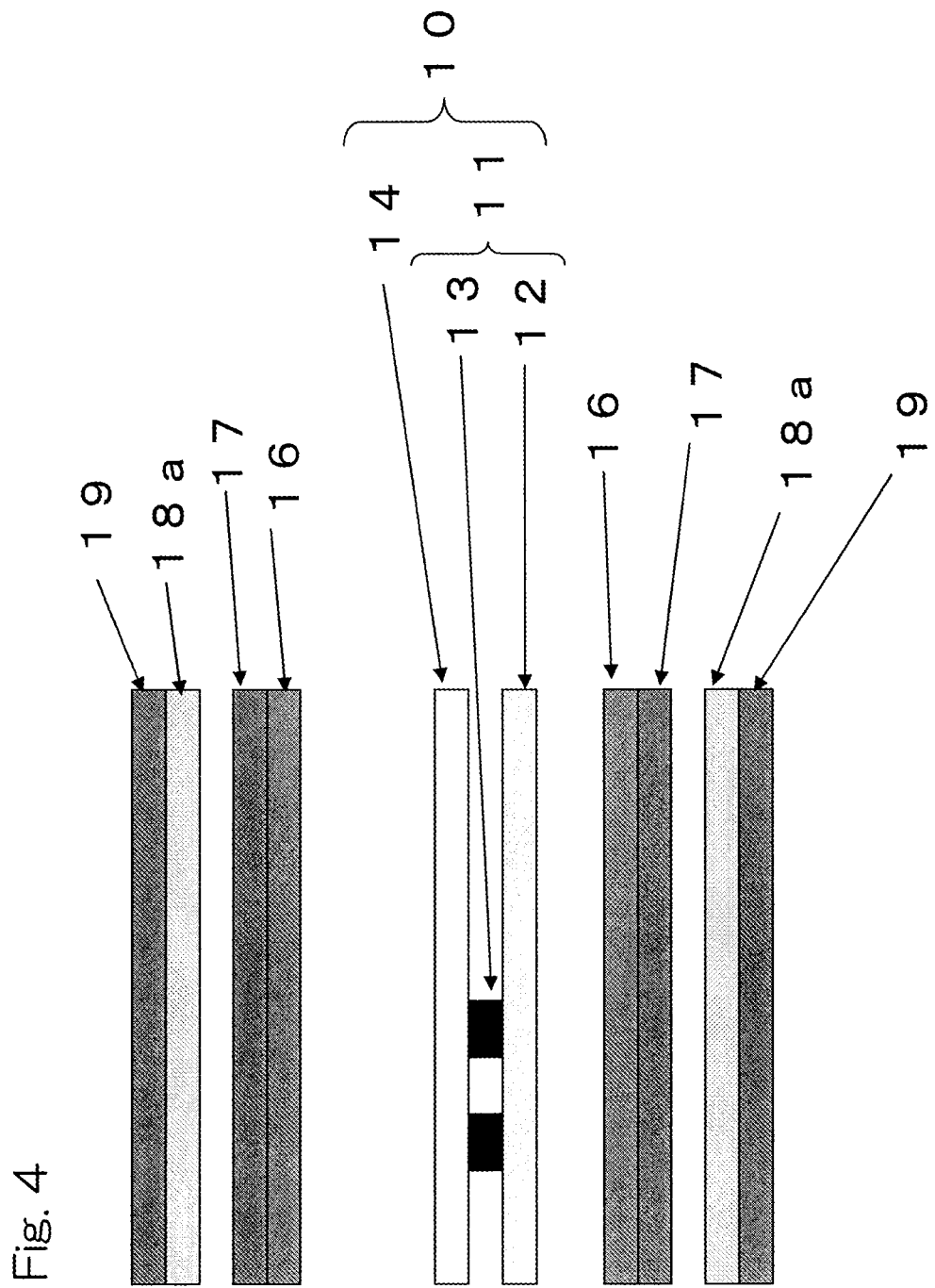
FIG. 4 is a schematic cross-sectional view for describing the configuration of a release material used in Comparative Examples 1 to 3.

The thermoplastic liquid crystal polymer cover film (A) produced in Reference Example 1 was placed on the disposed wiring pattern of the board produced in Reference Example 3, and thermocompression bonding was conducted thereon with release materials having a configuration (2) shown in FIG. 4 using the vacuum hot press apparatus under a condition of a temperature of 290° C. and pressure of a 20 kg/cm². The results are shown in Table 7.

It should be noted that, each of the release material shown in FIG. 4 has the same configuration as the release material shown in FIG. 1 except that the second high-density polyethylene film 18b is not included therein.

Comparative Example 2

The thermoplastic liquid crystal polymer cover film (C) produced in Reference Example 4 was placed on the disposed wiring pattern of the board produced in Reference Example 3, and thermocompression bonding was conducted thereon with the release materials having the configuration (2) shown in FIG. 4 using the vacuum hot press apparatus under a condition of a temperature of 290° C. and a pressure of 20 kg/cm². The results are shown in Table 7.

Comparative Example 3

The thermoplastic liquid crystal polymer cover film (A) produced in Reference Example 1 was placed on the disposed wiring pattern of the board produced in Reference Example 3, and thermocompression bonding was conducted thereon with the release materials having the configuration (2) shown in FIG. 4 using the vacuum hot press apparatus under a condition of a temperature of 300° C. and a pressure of 20 kg/cm². The results are shown in Table 7.

Comparative Example 4

The thermoplastic liquid crystal polymer cover film (A) produced in Reference Example 1 was placed on the disposed wiring pattern of the board produced in Reference Example 3, and thermocompression bonding was conducted thereon with release materials having a configuration (3) shown in FIG. 5, using the vacuum hot press apparatus under a condition of a temperature of 300° C. and a pressure of 20 kg/cm². The results are shown in Table 7.

It should be noted that, each of the release materials shown in FIG. 5 is obtained by laminating an ultrahigh-molecular-weight polyethylene film 26 and an aluminum foil 29.

Comparative Example 5

A polyimide cover film [NIKAFLEX CISV (KAPTON (Registered trademark) having a thickness of 12.5 μm and a thickness of an adhesive of 25 μm) manufactured by NIKKAN INDUSTRIES Co., Ltd.] was placed on the disposed wiring pattern of the board produced in Reference Example 3, and thermocompression bonding was conducted thereon using the vacuum hot press apparatus under a condition of a temperature of 200° C. and a pressure of 20 kg/cm$^2$. Physical properties of the obtained circuit board are shown in Table 7.

as a cover film, due to the release materials different from those in Examples, cover films have the deviation of thicknesses of t1 to t3 and the deviation of thicknesses of t1 to t7 of both not lower than 30%, and fail to reduce transmission loss of the circuit boards. Furthermore, since the distance G between differential signal lines is changed by the coating with the cover film, the differential impedance that has been pattern-designed in the conductor circuit is also changed.

In addition, in the circuit board in Comparative Example 5, since a polyimide film is used as a cover film, it is not possible to reduce deviation of thickness, and, as a result, transmission loss becomes large.

The circuit board of the present invention can be used as functional circuits or boards connecting functional modules in electric/electronic products. In particular, even when the circuit board is used as a circuit required for high-speed transmission such as a differential signal circuit, it is pos-

TABLE 7

| | | Cover Film | | | | Circuit Board | | | | |
|---|---|---|---|---|---|---|---|---|---|---|
| | | | | | | | Inter | | | |
| | Lamination Method | Type | Dielectric Constant | Thermal Expansion Coefficient (ppm/° C.) | Deviation of Thickness (%) | Bonding strength (kN/m) | Imped- ance (Ω) | Differential- signal-line Distance G (μm) | Transmission Loss 40 GHz, 23° C., 60RH (dB/100 mm) | Transmission Loss 40 GHz, 60° C., 90RH (dB/100 mm) |
| Example 1 | Configuration 1 | (A) | 3.0 | 18.0 | A | 1.0 | 100 | 80 | 5.5 | 6.0 |
| Example 2 | Configuration 1 | (C) | 3.0 | 18.0 | A | 1.0 | 100 | 80 | 5.5 | 6.0 |
| Example 3 | Configuration 1' | (A) | 3.0 | 18.0 | A | 1.0 | 100 | 80 | 5.5 | 6.0 |
| Example 4 | Configuration 1 | (B) | 3.0 | 18.0 | A | 1.2 | 100 | 80 | 5.5 | 6.0 |
| Example 5 | Configuration 1' | (B) | 3.0 | 18.0 | A | 1.0 | 100 | 80 | 5.5 | 6.0 |
| Comparative Example 1 | Configuration 2 | (A) | 3.0 | 18.0 | C | 1.0 | 110 | 120 | 6.5 | 7.5 |
| Comparative Example 2 | Configuration 2 | (C) | 3.0 | 18.0 | C | 1.0 | 115 | 120 | 6.5 | 7.5 |
| Comparative Example 3 | Configuration 2 | (A) | 3.0 | 18.0 | C | 1.0 | 115 | 120 | 6.5 | 7.5 |
| Comparative Example 4 | Configuration 3 | (A) | 3.0 | 18.0 | C | 1.0 | 110 | 120 | 6.5 | 7.5 |
| Comparative Example 5 | — | Polyimide | 3.4 | 27.0 | C | 1.0 | 100 | 80 | 11 | 14 |

With regard to lamination method, iConfiguration 1 employs an ultrahigh-molecular-weight polyethylene film as a low friction film, and Configuration 1' employs a PTFE film as a low friction film.

As shown in Table 7, even when each of the circuit boards of Examples 1 to 5 was covered with a cover film, the deviation of thicknesses of t1 to t3 as well as the deviation of thicknesses of t1 to t7 in the cover film providing a coating are all not higher than 5%, and it is possible to reduce transmission loss of the circuit boards. In particular, in Examples 1 to 5, transmission losses are lower than in any of Comparative Examples even at high temperature and under high moisture. More specifically, the transmission losses in Examples 1 to 5 are all lower than the transmission losses in Comparative Examples not only at 60° C. under 90 RH, but also at 23° C. under 60 RH. In addition, since the distance G between differential signal lines can be maintained, it is possible to prevent change in differential impedance that has been pattern-designed in the conductor circuit. Furthermore, each of the circuit boards of Examples 1 to 5 has superior adhesive property between the cover film and the board structural body.

On the other hand, in each of the circuit boards of Comparative Examples 1 to 4, although the liquid crystal polymer films identical to those in Examples 1 to 5 are used sible to prevent deterioration of signals transmitted at high speed. In addition, the method of manufacturing the circuit board of the present invention can efficiently manufacture a circuit board having such superior properties.

Although the present invention has been fully described in connection with the preferred embodiments thereof with reference to the accompanying drawings which are used only for the purpose of illustration, those skilled in the art will readily conceive numerous changes and modifications within the framework of obviousness upon the reading of the specification herein presented of the present invention. Accordingly, such changes and modifications are, unless they depart from the scope of the present invention as delivered from the claims annexed hereto, to be construed as included therein.

What is claimed is:
1. A release material comprising:
    a low friction film having a coefficient of static friction, defined by JIS K 7125, of not larger than 0.30,
    a first aluminum foil arranged on the low friction film, a first high-density polyethylene film arranged on the first aluminum foil, a second high-density polyethylene film arranged on the first high-density polyethylene film and positioned such that MD direction of the second high-density polyethylene film is perpendicular to MD direction of the first high-density polyethylene film, and a second aluminum foil arranged on the second high-density polyethylene film.

2. The release material according to claim 1, wherein the low friction film is selected from the group consisting of an ultrahigh-molecular-weight polyethylene film and a polytetrafluoroethylene film.

3. The release material according to claim 1, wherein each of the high-density polyethylene films has a viscosity average molecular weight of from 20,000 to 500,000.

4. The release material according to claim 1, wherein each of the high-density polyethylene films has a melt flow index of 0.03 to 0.08.

5. The release material according to claim 2, wherein the low friction film is the ultrahigh-molecular-weight polyethylene film, and the ultrahigh-molecular-weight polyethylene film has a viscosity average molecular weight of not lower than 1,000.000.

6. The release material according to claim 2, wherein the low friction film is the polytetrafluoroethylene film, and the polytetrafluoroethylene film has an apparent melt viscosity at 380° C. of not lower than $10^{10}$ poise.

7. A method of using the release material of claim 1 for heat treatment of a thermoplastic liquid crystal polymer film, the method comprising interposing the release material between the thermoplastic liquid crystal polymer film and a heat-processing device.

8. The method according to claim 7, wherein the thermoplastic liquid crystal polymer film is a cover film; and a board structural body including a board and a conductor circuit element disposed on at least one surface of the board is covered with the cover film.

* * * * *